United States Patent
Chen et al.

(10) Patent No.: US 8,183,106 B2
(45) Date of Patent: May 22, 2012

(54) APPARATUS AND ASSOCIATED METHOD FOR MAKING A FLOATING GATE MEMORY DEVICE WITH BURIED DIFFUSION DIELECTRIC STRUCTURES AND INCREASED GATE COUPLING RATIO

(75) Inventors: Kuan Fu Chen, Taipei (TW); Yin Jen Chen, Taipei (TW); Meng Hsuan Weng, Taichung (TW); Tzung Ting Han, Yilan (TW); Ming Shang Chen, Hsinchu (TW); Chun Pei Wu, Nantou (TW)

(73) Assignee: Macronix International Co., Ltd. (TW)

( * ) Notice: Subject to any disclaimer, the term of this patent is extended or adjusted under 35 U.S.C. 154(b) by 1002 days.

(21) Appl. No.: 11/460,216

(22) Filed: Jul. 26, 2006

(65) Prior Publication Data

US 2008/0026527 A1 Jan. 31, 2008

(51) Int. Cl.
*H01L 21/3205* (2006.01)
*H01L 21/336* (2006.01)
*H01L 21/8238* (2006.01)

(52) U.S. Cl. ........ 438/201; 438/211; 438/264; 438/299; 438/594; 257/E21.209; 257/E21.422

(58) Field of Classification Search ........... 257/E21.209, 257/E21.422; 438/257, 264, 299, 594
See application file for complete search history.

(56) References Cited

U.S. PATENT DOCUMENTS

| | | | |
|---|---|---|---|
| 6,051,467 A | 4/2000 | Chan et al. | |
| 6,171,909 B1 * | 1/2001 | Ding et al. | 438/267 |
| 6,380,068 B2 * | 4/2002 | Jeng et al. | 438/626 |
| 6,576,514 B2 * | 6/2003 | Liu et al. | 438/259 |
| 6,576,515 B2 * | 6/2003 | Chang | 438/259 |
| 6,576,537 B2 * | 6/2003 | Tseng | 438/594 |
| 6,613,630 B2 * | 9/2003 | Lee | 438/257 |
| 6,624,023 B1 | 9/2003 | Han et al. | |
| 6,673,713 B2 * | 1/2004 | Yin et al. | 438/636 |
| 6,897,116 B2 | 5/2005 | Lee et al. | |
| 6,960,506 B2 * | 11/2005 | Chiu et al. | 438/257 |
| 7,279,385 B2 * | 10/2007 | Lai et al. | 438/260 |
| 2002/0102793 A1 * | 8/2002 | Wu | 438/257 |

* cited by examiner

*Primary Examiner* — Charles Garber
*Assistant Examiner* — Ron Pompey
(74) *Attorney, Agent, or Firm* — Baker & McKenzie LLP

(57) ABSTRACT

A method for fabricating a floating gate memory device comprises using self-aligned process for formation of a fourth poly layer over a partial gate structure that does not require an additional photolithographic step. Accordingly, enhanced device reliability can be achieved because a higher GCR can be maintained with lower gate bias levels. In addition, process complexity can be reduced, which can increase throughput and reduce device failures.

26 Claims, 8 Drawing Sheets

APPARATUS AND ASSOCIATED METHOD FOR MAKING A FLOATING GATE MEMORY DEVICE WITH BURIED DIFFUSION DIELECTRIC STRUCTURES AND INCREASED GATE COUPLING RATIO

BACKGROUND

1. Field of the Invention

The embodiments described herein are directed to methods for fabricating non-volatile memory devices, and more particularly to methods for fabricating floating gate memory devices.

2. Background of the Invention

Current applications for non-volatile memory devices require that the devices be smaller, yet at the same time comprise higher densities. To meet these demands, memory cell sizes must get smaller. For example, it is well known to use virtual ground array designs in order to reduce the cell size for floating gate memory cells and non-volatile memory products, such as flash memory products. In general, however, a smaller cell size leads to smaller buried diffusion sizes, which are not necessarily compatible with conventional processing techniques and can lead to other problems.

For example, one problem that can occur as a result of the reduced buried diffusion sizes when using a conventional fabrication technique is a reduced gate coupling ratio (GCR) between the control gate and floating gate. Sufficient coupling is of course required in order to ensure that an adequate field is present in order to induce carriers to pass through the tunnel oxide layer onto the floating gate.

FIG. 1 is a schematic representation of a conventional floating gate memory cell 100. Memory cell 100 comprises a substrate 102 with diffusion regions 104 and 106 formed therein. For example, substrate 102 can be a P-type substrate and diffusion regions 104 and 106 can be N-type diffusion regions. In other embodiments, cell 100 can comprise an N-type substrate 102 with P-type diffusion regions 104 and 106. Although it will be understood that a P-type substrate is generally preferred.

Cell 100 further comprises a gate dielectric layer, sometimes referred to as a tunnel dielectric layer, 108 formed over substrate 102 between diffusion regions 104 and 106. A floating gate 110 is then formed over gate dielectric 108. Floating gate 110 is typically formed from a polysilicon. An inter-polysilicon (poly) dielectric layer 112 then separates floating gate 110 from a control gate 114. Control gate 114 is also typically formed from polysilicon. Inter-poly dielectric layer 112 can be formed from, e.g., a silicon dioxide ($SiO_2$) material. In other embodiments, inter-poly dielectric 112 can comprise a multi-layer structure such as a Oxide-Nitride-Oxide (ONO) structure.

In operation, a high voltage is applied to control gate 114 in order to program cell 100. This voltage is coupled with floating gate 110 via a control gate capacitance ($C_{CG}$). The coupled voltage causes an inversion channel to be formed in the upper layer of substrate 102 between diffusion regions 104 and 106. Voltages are then applied to diffusion regions 104 and 106 so as to create a large lateral electric field that will cause carriers to flow through the channel, e.g., from diffusion region 104 towards diffusion region 106.

The voltage coupled with floating gate 110 will create an electric field sufficient to cause some of the carriers to tunnel through tunnel dielectric 108 into floating gate 110. In other words, the voltage coupled with floating gate 110 needs to be capable of producing an electric field that can supply the carriers with enough energy to allow them to overcome the barrier height of gate dielectric 108. Accordingly, as mentioned above, sufficient coupling between control gate 114 and floating gate 110 is required in order to ensure that an adequate field is present to induce carriers to pass through tunnel dielectric 108 into floating gate 110.

It is important, therefore, to maintain adequate GCR in virtual ground arrays. As is understood, the GCR is a function of the $C_{GC}$ as well as the Source Capacitance ($C_S$), Bulk Capacitance ($C_B$), and Drain Capacitance ($C_D$) illustrated in FIG. 1. The relationship is defined as:

$$GCR = C_{CG}/(C_S + C_B + C_D + C_{CG})$$

Accordingly, the GCR can be increased by increasing $C_{CG}$, which can be increased by increasing the area of overlap between the floating gate and the control gate. Stated another way, the GCR can be increased by increasing the surface area of inter-poly dielectric layer 112 between the control gate and the floating gate. As can be seen in FIG. 2, which illustrated a cross sectional view of a portion of a conventional floating gate memory device 200, an increased inter-poly area is conventionally achieved by including what is called a fourth poly layer 216.

Device 200 comprises a substrate 202 with diffusion regions 204, 206, and 208 formed therein. Each cell in device 200 then comprises a gate structure formed over substrate 202 and buried diffusion oxide structures 210 in contact with diffusion regions 204, 206, and 208. Each gate structure comprises a gate dielectric layer 212 and a floating gate structure formed from a first poly layer 214 and a fourth poly layer 216. Each gate structure also comprises an inter-poly layer 218 and a control gate structure formed from a second poly layer 220.

Thus, each gate structure is formed by depositing a dielectric layer 212 and a polysilicon layer 214 on substrate 202. A silicon nitride layer is then typically formed over polysilicon layer 214. The layers are then patterned using photolithography techniques and etched accordingly. After the buried diffusion oxide structures 210 are formed, another polysilicon layer, i.e., fourth poly layer 216, is formed over polysilicon layer 214. Fourth poly layer 214 is then patterned and etched to form the structure illustrated in FIG. 2. Inter-poly dielectric layer 218 is then formed over fourth poly layer 216.

By including fourth poly layer 216, the surface area of inter-poly dielectric layer 218 between the fourth poly layer 216 and the second poly layer 220 can be increased, which increases the GCR. Unfortunately, including fourth poly layer 216 increases the complexity of the process because it requires additional photolithographic steps, which are costly and can be difficult to implement due to alignment issues.

SUMMARY

A method for fabricating a floating gate memory device comprises using a self-aligned process for formation of the fourth poly layer that does not require an extra lithographic step. The fourth poly layer increases the surface area of the inter-poly dielectric level between the control gate and the floating gate regions. By doing this, a high GCR can be accomplished without the introduction of additional photolithographic steps, which can be costly and a source for mis-processing or misalignment. Enhanced device performance and reliability can be achieved because a higher GCR can be maintained with lower gate bias levels. In addition, process complexity can be reduced, which can increase throughput and reduce device failures.

These and other features, aspects, and embodiments of the invention are described below in the section entitled "Detailed Description."

BRIEF DESCRIPTION OF THE DRAWINGS

Features, aspects, and embodiments of the inventions are described in conjunction with the attached drawings, in which.

DETAILED DESCRIPTION

The embodiments described below are directed to floating gate flash memory devices. It will be understood, however, that the embodiments described herein are also applicable to virtual ground memory arrays. It will also be understood that any dimensions, measurements, ranges, test results, numerical data, etc., are approximate in nature and unless otherwise stated, are not intended as precise data. The nature of the approximation involved will depend on the nature of the data, the context, and the specific embodiments or implementations being discussed.

Figure 1:
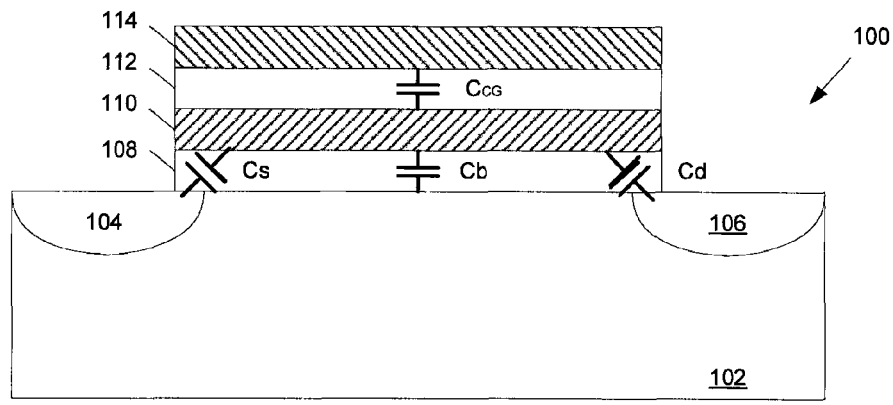
FIG. 1 is a schematic diagram illustrating a conventional floating gate memory cell.
Figure 2:
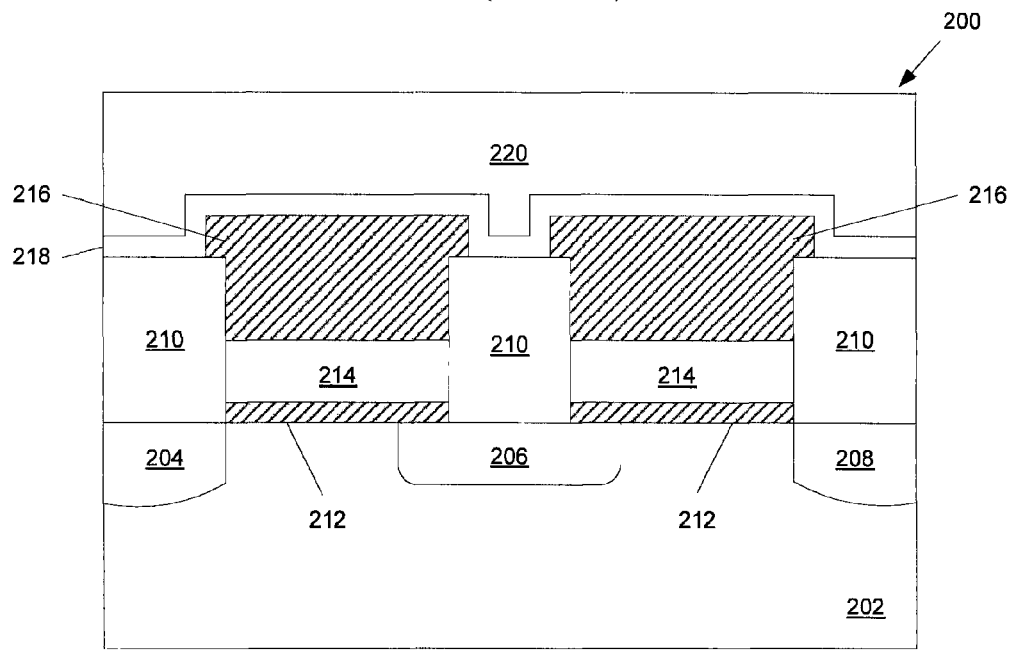
FIG. 2 is a cross-sectional, schematic diagram illustrating a floating gate memory device fabricated using a conventional fabrication process.
Figure 3:
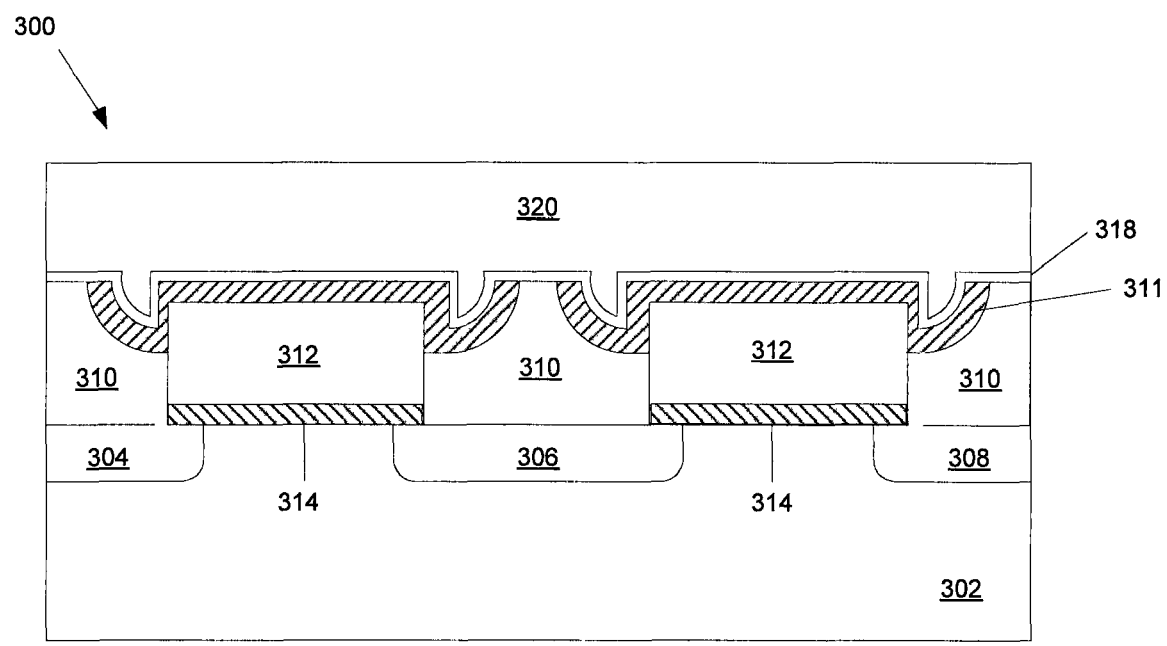
FIG. 3 is a cross-sectional, schematic diagram illustrating a floating gate memory device fabricated in accordance with one embodiment that utilizes a more efficient process.

FIG. 3 is a diagram illustrating a portion of a floating gate memory device 300 configured in accordance with one embodiment. Device 300 comprises a substrate 302, which can be a P-type or N-type substrate depending on the embodiment. Diffusion regions 304, 306, and 308 are then formed in substrate 302. Diffusion regions 304, 306, and 308 can be N-type diffusion regions or P-type diffusion regions depending on the type of substrate 302. Each cell in device 300 also comprises a gate structure and buried diffusion oxide structures 310 in contact with the diffusion regions.

As can be seen, buried diffusion oxide structures 310 comprise a unique shape that allows for the self-aligned formation of a thin fourth poly layer 311 in the gate structure. Thus, each gate structure comprises a gate dielectric layer 314 formed on substrate 302 between diffusion regions (304, 306, 308), and a floating gate structure that comprises first poly layer 312 and fourth poly layer 311. An inter-poly dielectric layer 318 is then formed over the gate structures as illustrated. Control gates are then formed from second poly layer 320, which is formed over inter-poly dielectric layer 318. Because of the unique shape of varied diffusion oxide structures 310, an increased inter-poly surface area can be achieved for each gate structure. Further, device 300 can be fabricated using an efficient process as described in more detail below.

Figure 4:
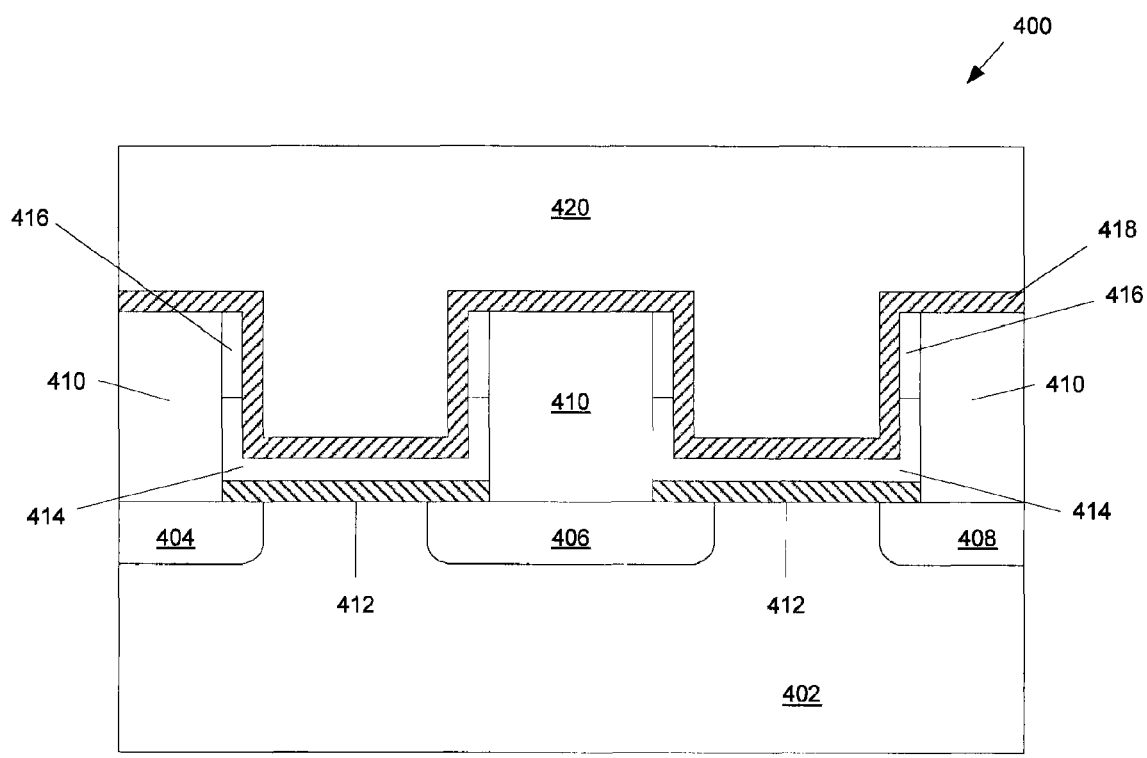
FIG. 4 is a cross-sectional, schematic diagram illustrating a floating gate memory device fabricated in accordance with another embodiment.

FIG. 4 is a diagram illustrating a portion of a floating gate memory device 400. Device 400 comprises a substrate 402, which again can be a P-type or N-type substrate, and N-type or P-type diffusion regions 404, 406, and 408 formed therein. Varied diffusion oxide structures 410 are formed in contact with diffusion regions 404, 406, and 408 as illustrated. The gate structures comprise gate dielectric layers 412 and floating gate structures formed from first poly layers 414 and fourth poly layers 416. An inter-poly dielectric layer 418 is then formed over the gate structures and a second poly layer 420 is formed over inter-poly layer 418 as illustrated.

FIGS. 5A-5E are cross sectional, schematic diagrams illustrating initial process steps for fabricating both device 300 and device 400. FIGS. 6A-6E are cross sectional, schematic diagrams illustrating additional process steps for fabricating device 300 in accordance with one embodiment. FIGS. 7A-7C are cross sectional, schematic diagrams illustrating additional process steps for fabricating device 400 in accordance with one embodiment.

Figure 5A:
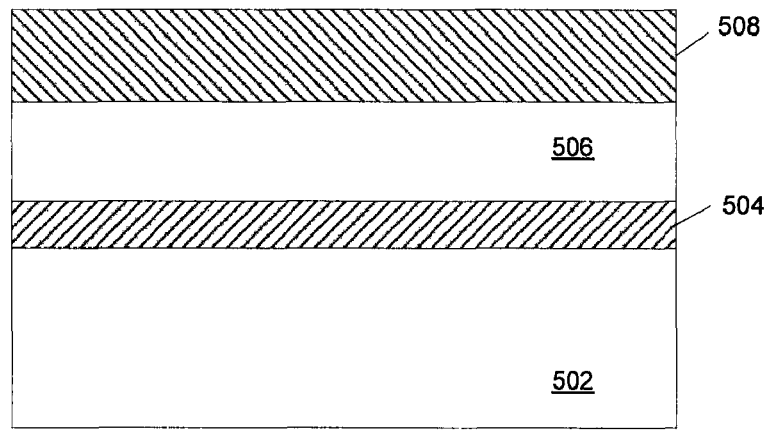
FIGS. 5A-5E are cross-sectional, schematic diagrams illustrating example initial process steps for fabricating the floating gate memory device of FIGS. 3 and 4.

Referring to FIG. 5A, a gate dielectric layer 504 is formed on a substrate 502. As explained above, substrate 502 can be a P-type or N-type substrate, although P-type substrates are often preferred. Dielectric layer 504 can be an oxide layer, such as $SiO_2$ layer. In other embodiments, gate dielectric layer 504 can be a multi layer structure, such as an ONO structure or an ON structure. In embodiments where gate dielectric layer 504 is an oxide layer, gate dielectric layer 504 can be thermally grown on substrate 502.

A polysilicon layer 506 is then formed on gate dielectric layer 504, and a cap layer, e.g., a nitride layer such as a silicon nitride layer (SiN), 508 is then formed on top of polysilicon layer 506. Polysilicon layer 506 is the first poly layer and is typically grown by a process known as Chemical Vapor Deposition (CVD). Cap layer 508 acts as an etching mask for polysilicon layer 506 and is also typically formed by CVD.

Figure 5B:
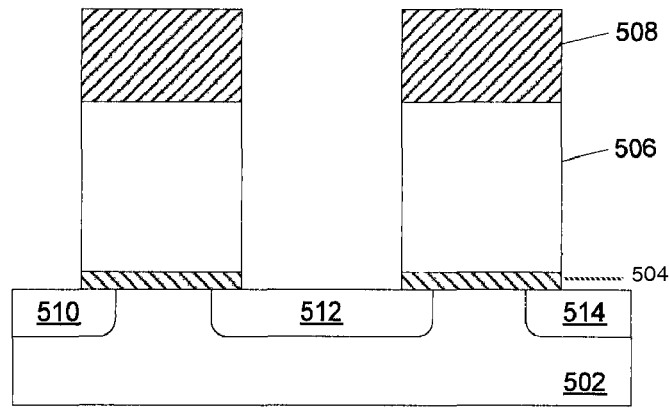

Referring to FIG. 5B, known photolithography and etching techniques are used to pattern and etch layers 504, 506, and 508. The remaining layers form portions of the gate structures as illustrated in FIG. 5B. Diffusion regions 510, 512, and 514 can then be implanted and heat-driven in substrate 502 using self-aligned gate techniques.

Figure 5C:
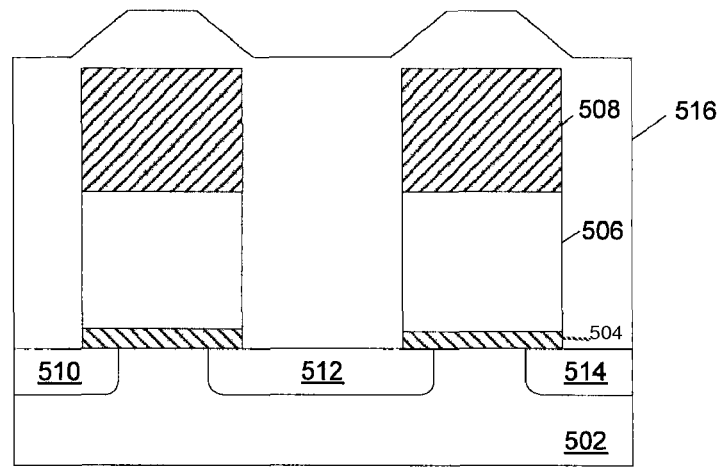
Figure 5D:
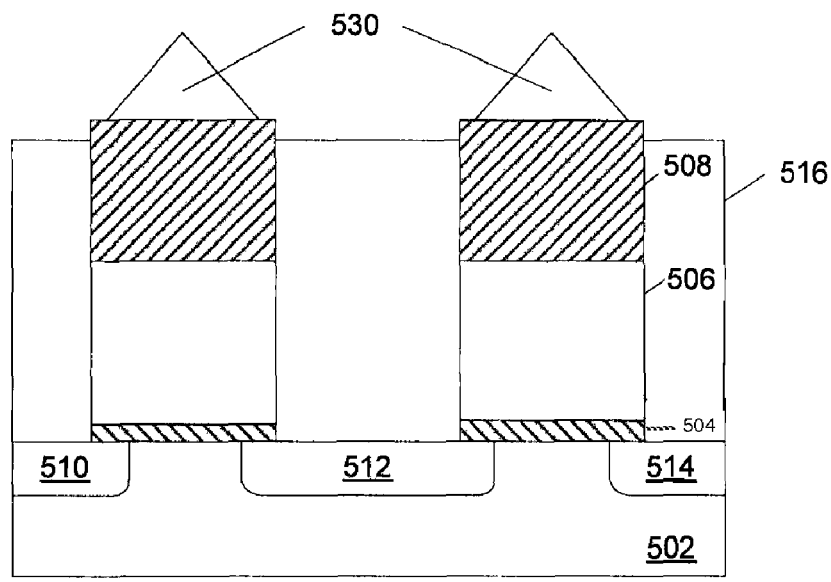

Referring to FIG. 5C, a dielectric layer 516 is then formed over substrate 502 as illustrated. Dielectric layer 516 can be, for example, a $SiO_2$ layer and can be formed using High Density Plasma (HDP)-CVD. Referring to FIG. 5D, a portion of dielectric layer 516 is removed to expose the upper corners of the remaining portions of cap layer 508. For example, a conventional wet etching, such HF or BOE (i.e., isotropic) process can be used to remove a portion of dielectric layer 516. Removing the right amount of dielectric layer 516 so that the upper corners of the remaining portions of cap layer 508 are exposed can be achieved by having a high etching selectivity ratio between dielectric layer 516 and cap layer 508.

Figure 5E:
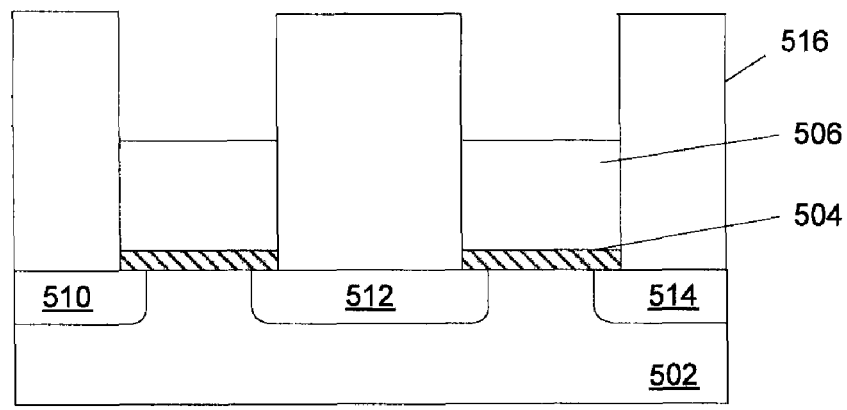

Referring to FIG. 5E, the remaining portions of cap layer 508 can then be removed, removing portions 530 of dielectric layer 516 in the process. For example, hot phosphoric acid can be used to remove the remaining portions of cap layer 508. Portions 530 of dielectric layer 516 will automatically be removed during the removal of the remaining portions of cap layer 508 because portions 530 are disconnected from the rest of dielectric layer 516. The process of removing the cap layer 508 can utilize the process described in commonly-assigned U.S. Pat. No. 6,380,068, which is hereby incorporated by reference into this application.

Figure 6A:
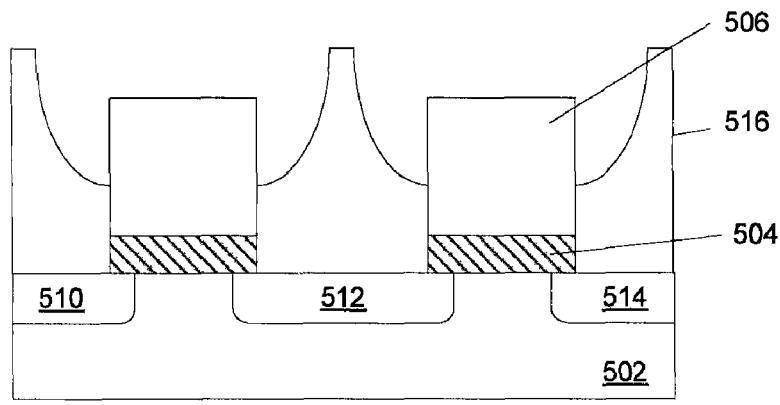
FIGS. 6A-6E are cross-sectional, schematic diagrams illustrating example additional process steps for fabricating the floating gate memory device of FIG. 3 in accordance with one embodiment.

As mentioned, if short channel lengths are not required for the memory cell, then the process that is illustrated in the cross-sectional, schematic diagrams of FIG. 6A-6E can be performed. Accordingly as illustrated in FIG. 6A, a wet etching (i.e., isotropic) process is performed in order to partially etch the remaining portions of dielectric layer 516.

Figure 6B:
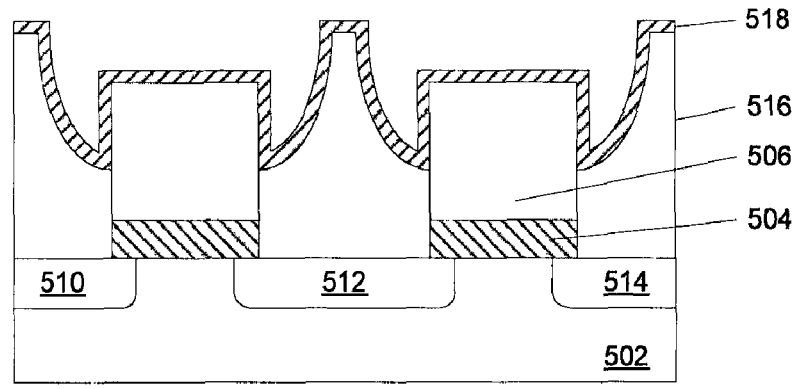
Figure 7A:
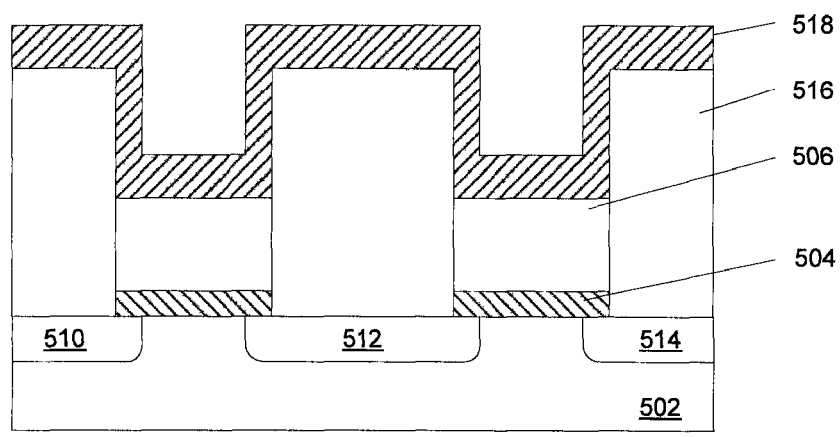
FIGS. 7A-7C are cross-sectional, schematic diagrams illustrating example additional process steps for fabricating the floating gate memory device of FIG. 4 in accordance with one embodiment.
Figure 7B:
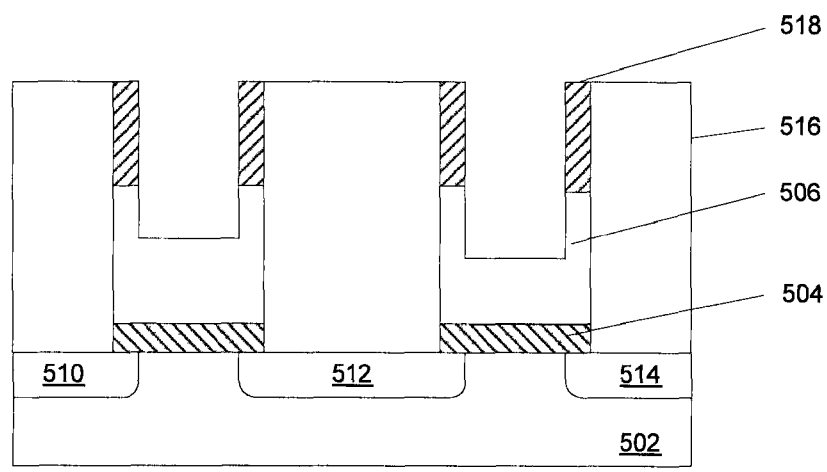
Figure 7C:
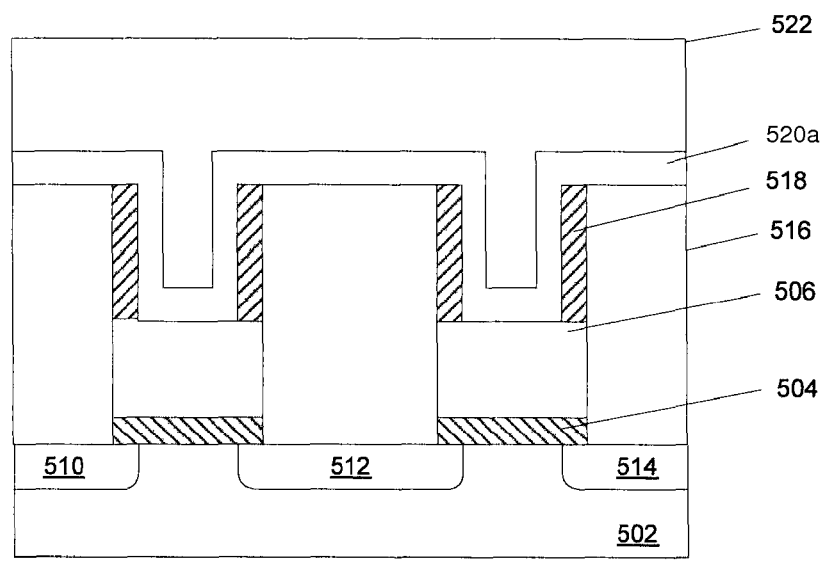

A thin polysilicon layer 518 can then be formed over the remaining portions of dielectric layer 516 and the remaining portions of polysilicon layer 506 as illustrated in FIG. 6B. Polysilicon layer 518 is the fourth poly layer and can be formed using CVD.

Figure 6C:
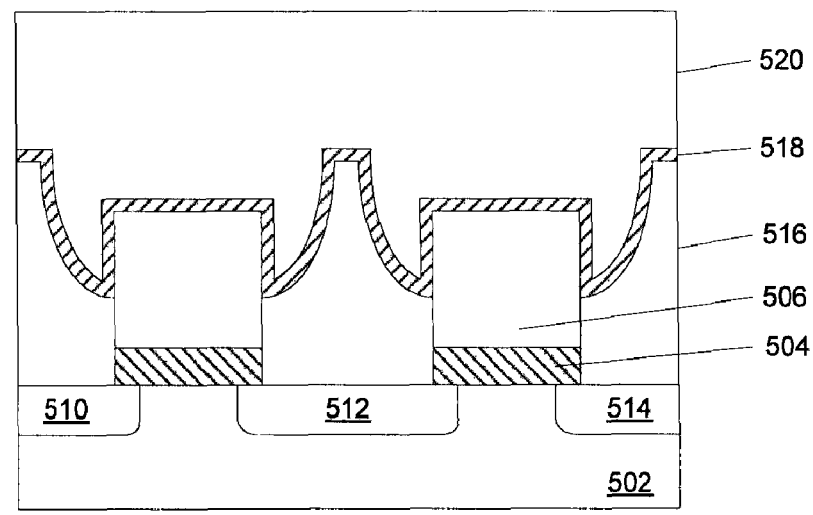
Figure 6D:
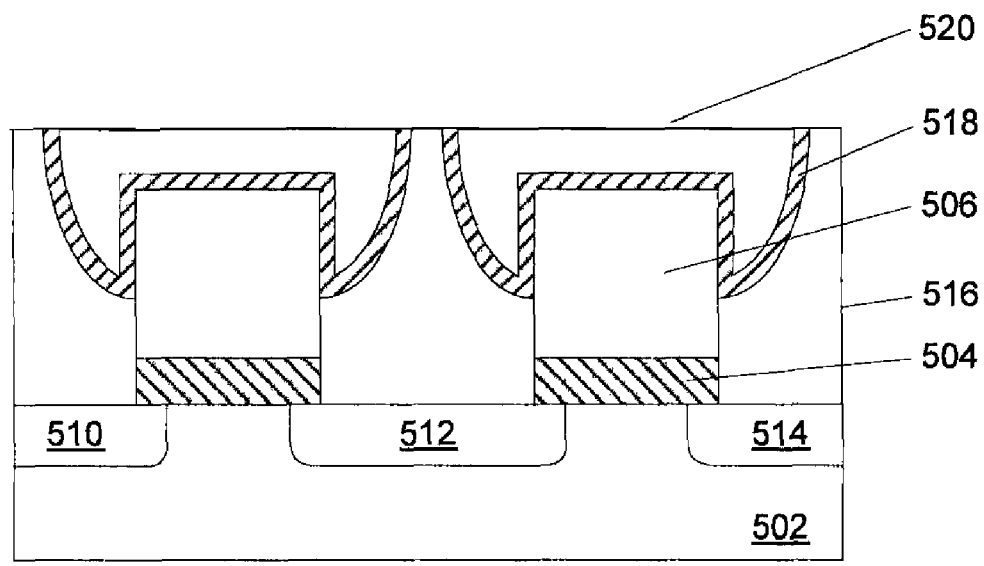
Figure 6E:
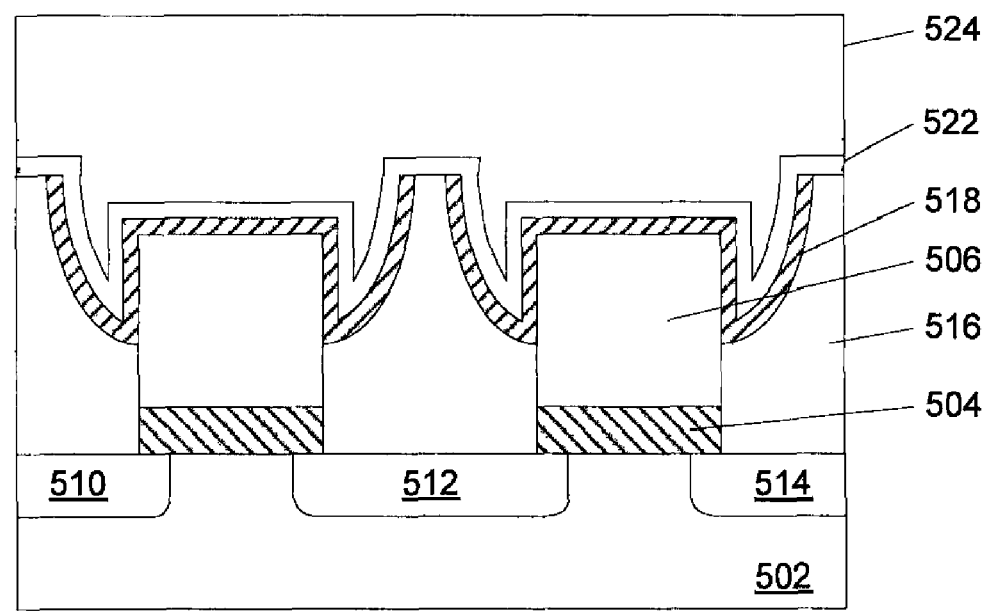

Referring to FIG. 6C, a Bottom Anti-Reflective Coating (BARC) layer 520 can then be formed over fourth poly layer 518. BARC layer 520 can, for example, be an inorganic BARC layer formed via CVD. It will be understood that BARC layers are used for tuned etched selectivity. Accordingly, referring to FIG. 6D, BARC layer 520 can be etched using oxide layer 516 as stop layer for the etching process. By using this technique, the etching process allows the fourth poly layer 518 to be self-aligned (as shown in FIG. 6E), thereby eliminating a costly photolithographic step to remove the undesired portions of the fourth poly layer 518.

Once the self-aligned etching process is complete, the remaining portion of BARC layer 520 can then be removed with a photoresist striping process. Next, an inter-poly dielectric layer 522 can be formed over poly layer 518. Polysilicon layer 524 can then be formed over inter-poly layer 522. The polysilicon layer 524 can be deposited using CVD.

Inter-poly dielectric layer 522 can, depending on the embodiment, comprise a multi-layer structure, such as an ONO structure. In such instances, formation of inter-poly dielectric layer 522 is a multi-step process, wherein the multiple layers comprising the multi-layer structure are formed in sequence.

As mentioned above, a different process can be used. In such instances, after the steps illustrated in FIG. 5E, a thin polysilicon layer 518 can be formed over the remaining portions of first poly layer 506 as illustrated in FIG. 7A. For example, thin poly layer 518 can be formed using CVD.

Referring to FIG. 7B, the fourth poly layer 518 can be etched, e.g. using a dry (i.e., anisotropic) etch process. As can be seen, the etching process can partially etch the remaining portions of polysilicon layer 506. By using this technique, the etching process allows the fourth poly layer 518 to be self-aligned (as shown in FIG. 7B), thereby eliminating a costly photolithographic step to remove the undesired portions of the fourth poly layer 518.

Referring to FIG. 7C, an inter-poly dielectric layer 520a can then be formed over polysilicon layers 506 and 518. Again, inter-poly dielectric layer 520a can actually comprise a multi-layer structure, such as an ONO structure. Second poly layer 522 can then be deposited over inter-poly dielectric layer 520a. The process steps illustrated in FIGS. 7A-7C require fewer process steps than those shown in FIGS. 6A-6E, but are generally most suitable for devices with longer channel lengths.

Device processing can continue in accordance with conventional process techniques after the steps illustrated in FIG. 6E for device 300 and FIG. 7C for device 400. These steps can include the patterning and etching of the second poly layer, formation of a third poly layer, and patterning and etching of the third poly layer. Conventional Back End of the Line (BEOL) processing techniques can then be used to form the required metal interconnect layers.

While certain embodiments of the inventions have been described above, it will be understood that the embodiments described are by way of example only. Accordingly, the inventions should not be limited based on the described embodiments. Rather, the scope of the inventions described herein should only be limited in light of the claims that follow when taken in conjunction with the above description and accompanying drawings.

What is claimed is:

1. A method for forming a non-volatile memory device, comprising:
    providing a substrate having an upper surface;
    forming a partial gate structure over the substrate, the partial gate structure comprising a gate dielectric and a first polysilicon layer;
    forming source and drain regions in the substrate such that upper surfaces of the source and drain regions are substantially coplanar with the upper surface of the substrate;
    forming first and second dielectric structures directly over respective source and drain regions adjacent to the partial gate structure;
    partially removing portions of the first and second dielectric structures that are directly over source and drain regions;
    forming a thin polysilicon layer over the partial gate structure using a self-aligned process;
    forming an inter-poly dielectric layer over the thin polysilicon layer; and
    depositing a control gate polysilicon layer over the inter-poly dielectric layer.

2. The method of claim 1, further comprising:
    forming a gate dielectric layer over the substrate;
    forming a first polysilicon layer over the gate dielectric layer;
    forming a cap layer over the first polysilicon layer;
    patterning the gate dielectric, first polysilicon, and cap layers; and
    etching the patterned gate dielectric, first polysilicon, and cap layers to form the partial gate structure.

3. The method of claim 2, further comprising:
    forming a buried diffusion dielectric layer over the partial gate structure; and
    forming the first and second dielectric structures from the buried diffusion dielectric layer.

4. The method of claim 3, further comprising selectively etching the cap layer with respect to the buried diffusion dielectric layer.

5. The method of claim 4, wherein forming the diffusion dielectric structures and selectively etching the cap layer comprises:
    removing a part of the buried diffusion dielectric layer to expose part of the cap layer and to form portions of the buried diffusion dielectric layer that are above the cap layer and separate from portions of the buried diffusion dielectric layer that are on the sides of the cap layer; and
    removing the cap layer, wherein the portions of the buried diffusion dielectric layer the patterned cap layer are automatically removed along with the cap layer.

6. The method of claim 5, wherein removing a part of the buried diffusion dielectric layer comprises isotropically etching the buried diffusion dielectric layer.

7. The method of claim 5, wherein the cap layer is removed using hot phosphoric acid.

8. The method of claim 5, further comprising maintaining a high etching selectivity ratio between the cap layer and the buried diffusion dielectric layer.

9. The method of claim 1, wherein partially etching the first and second dielectric structures comprises an isotropic etch.

10. The method of claim 1, wherein forming the inter-poly dielectric layer comprises sequentially forming the layers comprising the multilayer structure.

11. The method of claim 1, further comprising anisotropically etching the thin polysilicon layer before forming the inter-poly dielectric layer.

12. The method of claim 11, wherein etching the thin polysilicon layer comprises depositing a Bottom Anti-Reflective Coating (BARC) layer over the thin polysilicon layer and etching the BARC layer using the buried diffusion dielectric layer as an etch stop.

13. The method of claim 12, further comprising selectively removing the remaining portions of the BARC layer.

14. The method of claim 2, wherein forming the buried diffusion dielectric layer comprises forming an oxide layer.

15. The method of claim 14, wherein the oxide layer is formed using high plasma density chemical vapor deposition.

16. The method of claim 1, wherein the gate dielectric layer is an oxide layer, and wherein forming the gate dielectric layer comprises thermally growing the gate dielectric layer on the substrate.

17. A method for forming a non-volatile memory device, comprising:
   providing a substrate having an upper surface;
   forming a gate dielectric layer over the substrate;
   forming a first polysilicon layer over the gate dielectric layer;
   forming a cap layer over the polysilicon layer; and
   patterning the gate dielectric, first polysilicon, and cap layers;
   etching the patterned gate dielectric, first polysilicon, and cap layers to form a partial gate structure over the substrate, the partial gate structure comprising a gate dielectric and a first polysilicon layer;
   forming source and drain regions in the substrate such that upper surfaces of the source and drain regions are substantially coplanar with the upper surface of the substrate;
   forming a buried diffusion dielectric layer over the partial gate structure and directly over the source and drain regions;
   removing a part of the buried diffusion dielectric layer to expose part of the cap layer and to form portions of the buried diffusion dielectric layer that are above the cap layer and separate from portions of the buried diffusion dielectric layer that are on the sides of the cap layer;
   removing the cap layer to form first and second dielectric structures adjacent to the partial gate structures, wherein the portions of the buried diffusion dielectric layer above the remaining portions of the patterned cap layer are automatically removed along with the cap layer;
   performing a partial isotropic etch on the first and second dielectric structures; and
   forming a thin polysilicon layer over the partial gate structure using a self-aligned process.

18. The method of claim 17, further comprising forming an inter-poly dielectric layer over the thin polysilicon layer, and depositing a control gate polysilicon layer over the inter-poly dielectric layer.

19. The method of claim 17, wherein performing a partial isotropic etch on the buried diffusion dielectric layer comprises wet etching the buried diffusion dielectric layer.

20. The method of claim 17, wherein the patterned cap layer is removed using hot phosphoric acid.

21. The method of claim 20, further comprising maintaining a high etching selectivity ratio between the cap layer and the buried diffusion dielectric layer.

22. The method of claim 17, wherein forming the inter-poly dielectric layer comprises sequentially forming layers comprising the multilayer structure.

23. The method of claim 17, further comprising etching the thin polysilicon layer before forming the inter-poly dielectric layer.

24. The method of claim 23, wherein etching the thin polysilicon layer comprises depositing a Bottom Anti-Reflective Coating (BARC) layer over the thin polysilicon layer and etching the BARC layer using the buried diffusion dielectric layer as an etch stop.

25. The method of claim 17, wherein forming the buried diffusion dielectric layer comprises forming an oxide layer.

26. The method of claim 25, wherein the oxide layer is formed using high plasma density chemical vapor deposition.

* * * * *